United States Patent
Xue et al.

(10) Patent No.: US 11,870,172 B2
(45) Date of Patent: Jan. 9, 2024

(54) OPENED SLOTTED CONNECTOR ASSEMBLY

(71) Applicants: Tyco Electronics (Shanghai) Co. Ltd., Shanghai (CN); Tyco Electronics Holdings (Bermuda) No. 7 Limited, Hamilton (BM); TE Connectivity Services GmbH, Schaffhausen (CH)

(72) Inventors: Zhaohai (Tim) Xue, Shanghai (CN); Ching-Lung Liu, Taipei (TW); Howard Andrews, Jr., Middletown, PA (US); Qianjin (Orando) Li, Shanghai (CN)

(73) Assignees: Tyco Electronics (Shanghai) Co., Ltd., Shanghai (CN); Tyco Electronics Holdings (Bermuda) No. 7 Limited, Hamilton (BM); TE Connectivity Solutions GmbH, Schaffhausen (CH)

( * ) Notice: Subject to any disclaimer, the term of this patent is extended or adjusted under 35 U.S.C. 154(b) by 0 days.

(21) Appl. No.: 17/386,698

(22) Filed: Jul. 28, 2021

(65) Prior Publication Data
US 2022/0037820 A1     Feb. 3, 2022

(30) Foreign Application Priority Data

Jul. 30, 2020 (CN) .......................... 202010751814.4

(51) Int. Cl.
*H01R 12/73* (2011.01)
*H01R 12/70* (2011.01)
*H01R 13/11* (2006.01)

(52) U.S. Cl.
CPC ....... *H01R 12/737* (2013.01); *H01R 12/7052* (2013.01); *H01R 13/11* (2013.01)

(58) Field of Classification Search
CPC .......... H05K 1/142; H05K 1/14; H05K 1/117; H01R 12/714; H01R 12/716;
(Continued)

(56) References Cited

U.S. PATENT DOCUMENTS 2,701,346 A * 2/1955 Powell ................. H01R 12/722
439/325
3,075,167 A * 1/1963 Kinkaid ............... H01R 13/432
439/749
(Continued)

FOREIGN PATENT DOCUMENTS

CN         1275825 A     12/2000
CN       201210535 Y      3/2009
(Continued)

OTHER PUBLICATIONS

Chinese First Office Action dated May 31, 2023 with English translation thereof, corresponding to Application No. 202010751814.4, 11 pages.

*Primary Examiner* — Marcus E Harcum
(74) *Attorney, Agent, or Firm* — Barley Snyder

(57) ABSTRACT

A connector assembly comprises a connector including an insulating housing formed with a slot extending in a longitudinal direction and having at least one open end. A first circuit board is inserted into the slot and includes an electrical contact pad for electrically contacting a conductive terminal arranged within the slot, the electrical contact pad of the first circuit board extends in the longitudinal direction outside of the insulating housing of the connector via the open end of the slot.

8 Claims, 5 Drawing Sheets

(58) Field of Classification Search
CPC .. H01R 12/737; H01R 12/52; H01R 12/7052; H01R 12/721; H01R 12/712; H01R 12/73; H01R 13/11
USPC .................................. 439/377, 68, 65, 637
See application file for complete search history.

(56) References Cited

U.S. PATENT DOCUMENTS

| | | | | |
|---|---|---|---|---|
| 3,533,045 A * | 10/1970 | Henschen | ............ | H01R 12/00 439/62 |
| 3,720,907 A * | 3/1973 | Asick | ............ | H01R 12/721 439/747 |
| 4,934,961 A * | 6/1990 | Piorunneck | ............ | H01R 43/16 439/59 |
| 5,035,631 A * | 7/1991 | Piorunneck | ............ | H01R 12/721 439/60 |
| 5,440,755 A * | 8/1995 | Harwer | ............ | H05K 1/14 710/105 |
| 5,522,737 A * | 6/1996 | Brunker | ............ | H01R 13/6471 439/60 |
| 5,580,257 A * | 12/1996 | Harwath | ............ | H01R 12/721 439/607.06 |
| 5,800,213 A * | 9/1998 | Regnier | ............ | H01R 12/721 439/733.1 |
| 5,943,215 A * | 8/1999 | Carney | ............ | H05K 7/1429 361/752 |
| 6,010,368 A * | 1/2000 | Tai | ............ | H01R 12/721 439/680 |
| 6,203,345 B1 | 3/2001 | Roque et al. | | |
| 6,254,435 B1 * | 7/2001 | Cheong | ............ | H01R 12/721 439/60 |
| 6,824,413 B1 * | 11/2004 | Shipe | ............ | H01R 12/7005 439/157 |
| 6,890,221 B2 * | 5/2005 | Wagner | ............ | H01R 13/113 439/825 |
| 7,168,961 B2 * | 1/2007 | Hsieh | ............ | H01R 12/725 439/74 |
| 7,303,401 B2 * | 12/2007 | Schell | ............ | H01R 12/7088 439/856 |
| 7,354,282 B2 * | 4/2008 | Margulis | ............ | H01R 13/04 439/660 |
| 7,416,452 B1 * | 8/2008 | Sabo | ............ | H01R 31/06 439/62 |
| 7,440,293 B2 * | 10/2008 | Hood, III | ............ | G06F 1/184 361/810 |
| 7,746,630 B2 * | 6/2010 | Tsai | ............ | G06F 1/185 361/752 |
| 7,794,259 B2 * | 9/2010 | Zhu | ............ | H01R 12/722 439/325 |
| 7,848,115 B2 * | 12/2010 | Casto | ............ | H05K 1/14 361/802 |
| 8,038,451 B2 * | 10/2011 | Peterson | ............ | H01R 12/7011 439/65 |
| 8,045,340 B2 * | 10/2011 | Heinrichs | ............ | G06F 1/185 361/810 |
| 8,057,266 B1 * | 11/2011 | Roitberg | ............ | H01R 13/055 439/907 |
| 8,262,395 B2 * | 9/2012 | Ke | ............ | H01R 13/11 439/79 |
| 8,317,542 B2 * | 11/2012 | Abraham | ............ | H01R 12/73 439/607.31 |
| 8,419,477 B1 * | 4/2013 | Yu | ............ | H01R 25/162 439/540.1 |
| 8,585,427 B2 * | 11/2013 | Ukawa | ............ | H01R 12/774 439/468 |
| 8,651,880 B2 * | 2/2014 | Wu | ............ | H01R 13/112 439/79 |
| 8,814,605 B2 * | 8/2014 | Yu | ............ | H01R 13/506 439/947 |
| 8,961,199 B2 * | 2/2015 | Tai | ............ | H01R 12/724 439/79 |
| 9,136,652 B2 * | 9/2015 | Ngo | ............ | H01R 24/20 |
| 9,190,747 B2 * | 11/2015 | Tateishi | ............ | H01R 12/7017 |
| 9,257,768 B2 * | 2/2016 | Hung | ............ | H01R 12/724 |
| 9,293,863 B2 * | 3/2016 | Dabov | ............ | H01R 13/639 |
| 9,478,885 B2 * | 10/2016 | MacDougall | ............ | H01R 12/73 |
| 9,685,724 B2 * | 6/2017 | Tojo | ............ | H01R 12/774 |
| 9,899,759 B2 * | 2/2018 | Yu | ............ | H01R 13/113 |
| 9,960,514 B1 * | 5/2018 | Chen | ............ | H01R 24/68 |
| 10,170,868 B1 * | 1/2019 | Oyake | ............ | H01R 13/652 |
| 10,411,382 B2 * | 9/2019 | Sichmann | ............ | H01R 13/113 |
| 10,490,920 B2 * | 11/2019 | Manickam | ............ | H01R 13/648 |
| 10,553,973 B2 * | 2/2020 | Copper | ............ | H01R 12/7088 |
| 10,581,196 B2 | 3/2020 | Liu et al. | | |
| 10,958,002 B2 * | 3/2021 | Copper | ............ | H01R 12/721 |
| 10,980,117 B1 * | 4/2021 | Maas | ............ | G06F 30/331 |
| 2002/0090841 A1 * | 7/2002 | Gillenberg | ............ | H01R 12/85 439/65 |
| 2002/0098743 A1 * | 7/2002 | Schell | ............ | H01R 12/7088 439/850 |
| 2004/0242052 A1 * | 12/2004 | Zhao | ............ | H01R 12/721 439/485 |
| 2005/0026463 A1 * | 2/2005 | Harris | ............ | H01R 12/7088 439/65 |
| 2007/0184676 A1 * | 8/2007 | Minich | ............ | H01R 12/714 439/65 |
| 2009/0291596 A1 * | 11/2009 | Miyazoe | ............ | H01R 12/721 439/636 |
| 2010/0167593 A1 * | 7/2010 | Yu | ............ | H01R 13/055 439/651 |
| 2011/0034084 A1 * | 2/2011 | Hsueh | ............ | H01R 13/506 439/629 |
| 2014/0051269 A1 * | 2/2014 | Chang | ............ | H01R 12/722 439/68 |
| 2014/0295680 A1 * | 10/2014 | YuQiang | ............ | H01R 12/724 439/55 |
| 2015/0044887 A1 | 2/2015 | Tateishi | | |
| 2015/0282319 A1 * | 10/2015 | Salzman | ............ | H05K 1/141 361/788 |
| 2018/0254573 A1 * | 9/2018 | Copper | ............ | H01R 13/02 |
| 2020/0358217 A1 * | 11/2020 | Takai | ............ | H01R 13/6471 |

FOREIGN PATENT DOCUMENTS

| | | | |
|---|---|---|---|
| CN | 101969166 A | 2/2011 | |
| CN | 202308504 U | 7/2012 | |
| CN | 104347983 A | 2/2015 | |
| CN | 205178056 U | 4/2016 | |
| CN | 109510015 A | 3/2019 | |
| CN | 113497373 A * | 10/2021 | ........... H01R 13/502 |
| WO | 2015021221 A1 | 2/2015 | |

* cited by examiner

OPENED SLOTTED CONNECTOR ASSEMBLY

CROSS-REFERENCE TO RELATED APPLICATIONS

This application claims priority under 35 U.S.C. § 119 to Chinese Patent Application No. 202010751814.4 filed on Jul. 30, 2020, the entire disclosure of which is incorporated herein by reference.

FIELD OF THE INVENTION

The present disclosure relates to an electrical connector, and more particularly, to an electrical connector and an associated assembly for a circuit board.

BACKGROUND

A power connector for a circuit board typically comprises an insulating housing and a conductive terminal. More specifically, the insulating housing is formed with a longitudinal slot having the conductive terminal accommodated therein. The circuit board is inserted into the slot and electrically contacts the conductive terminal. However, in these connectors of the prior art, the two longitudinal ends of the slot are closed. As a result, the circuit board cannot extend outside of the insulating housing in the longitudinal direction, thus limiting the size of an electrical contact pad on the circuit board, as well as reducing the current carrying and heat dissipation capacities of the power connector.

SUMMARY

A connector assembly according to an embodiment of the present disclosure comprises a connector including an insulating housing defining a slot with at least one open end extending in a longitudinal direction. A first circuit board is inserted into the slot and includes an electrical contact pad for electrically contacting a conductive terminal arranged within the slot. The electrical contact pad of the first circuit board extends in the longitudinal direction outside of the insulating housing of the connector via the open end of the slot.

BRIEF DESCRIPTION OF THE DRAWINGS

The invention will now be described by way of example with reference to the accompanying Figures, of which.

DETAILED DESCRIPTION OF THE EMBODIMENTS

Figure 1:
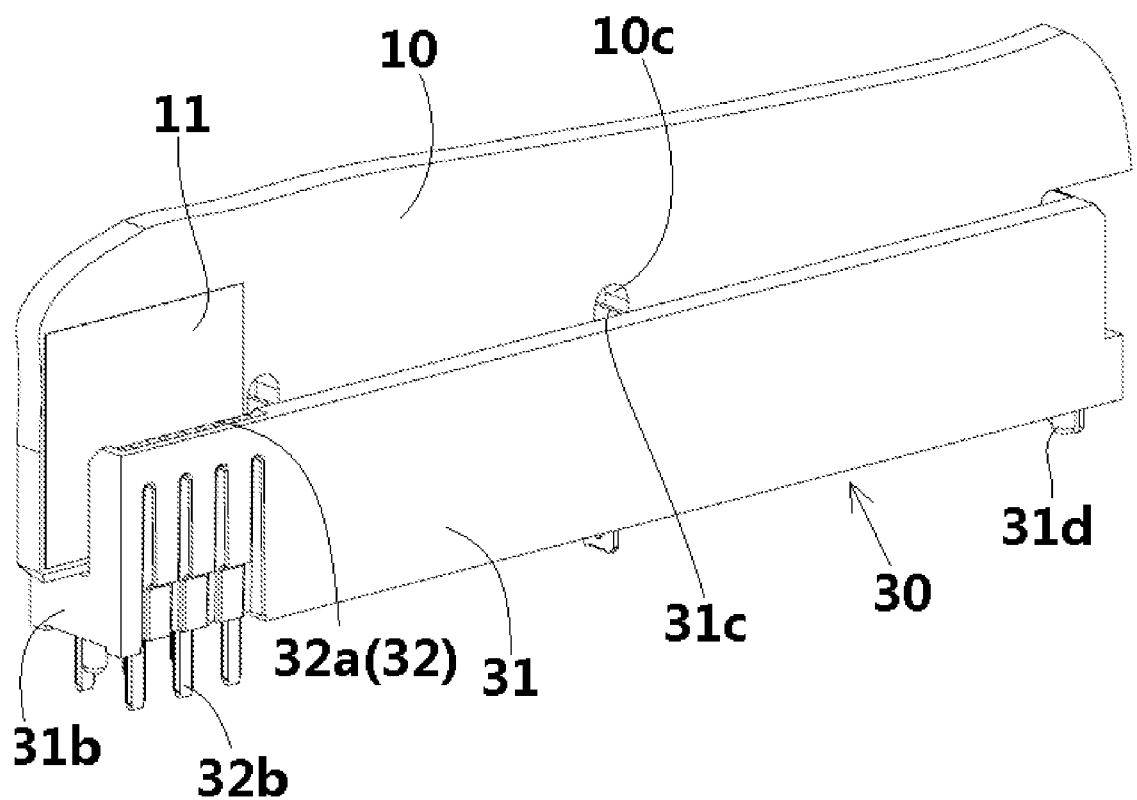
FIG. 1 shows a schematic perspective view of a connector and a first circuit board according to an exemplary embodiment of the present disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to an embodiment of the present disclosure, a connector assembly comprises a connector and a first circuit board. The connector includes an insulating housing formed with a slot extending in a longitudinal direction thereof, wherein at least one of two opposite ends of the slot is open, or unobstructed by an end wall, in the longitudinal direction. In this way, a circuit board inserted into the slot is free to extend outside of the insulating housing via the open end. The connector further includes a conductive terminal disposed in the slot. An electrical contact pad is formed on the first circuit board and extends outside of the insulating housing via the open end of the connector. The contact pad electrically contacts the conductive terminal of the connector when the first circuit board is inserted into the slot.

Figure 2:
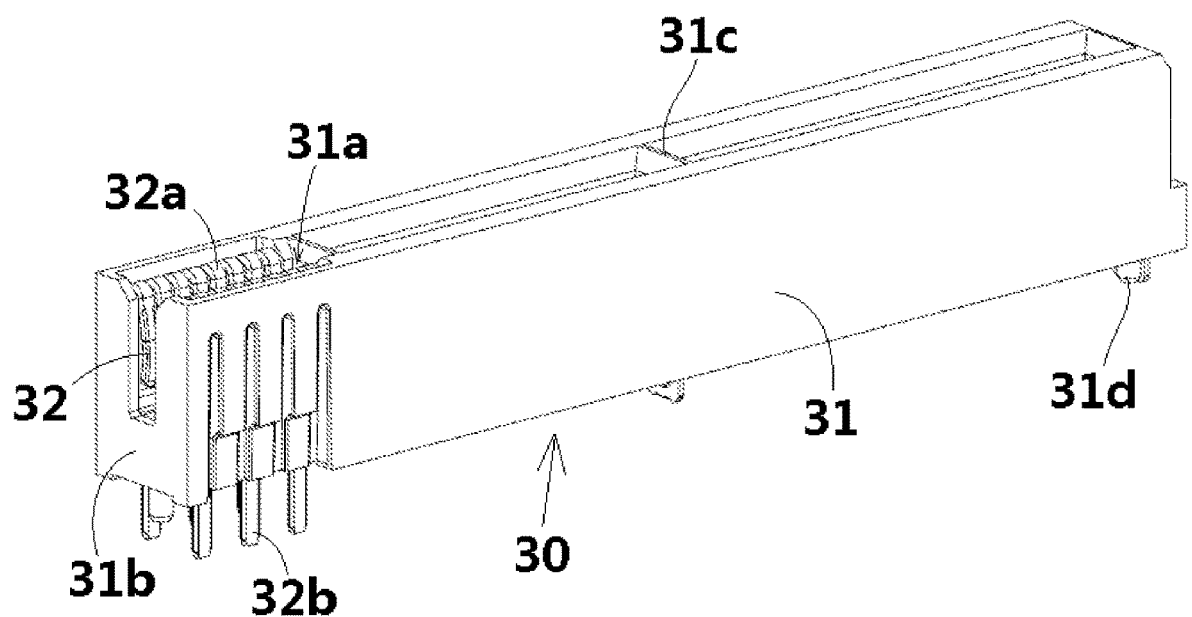
FIG. 2 shows a schematic perspective view of a connector according to an exemplary embodiment of the present disclosure.

FIG. 1 shows a schematic perspective view of a connector 30 and a first circuit board 10 according to an exemplary embodiment of the present disclosure. FIG. 2 shows a schematic perspective view of the connector 30 according to an exemplary embodiment of the present disclosure. As shown in FIGS. 1 and 2, the connector 30 comprises an insulating housing 31 and a conductive terminal 32. The insulating housing 31 is formed with a slot 31a extending in a longitudinal direction thereof. The conductive terminal 32 is disposed in the slot 31a of the insulating housing 31 and is adapted to electrically contact with a first circuit board 10 inserted into the slot 31a. At least one of two opposite ends of the insulating housing 31 in the longitudinal direction is an open end 31b without an end wall, such that the slot 31a is also open to the outside at the open end 31b, allowing the inserted first circuit board 10 to extend to the outside of the insulating housing 31. Likewise, an electrical contact pad 11 on the first circuit board 10 can also extend to the outside of the insulating housing 31 in the longitudinal direction, and thus the current carrying size (or referred to as width) and the heat dissipation area of the electrical contact pad 11 on the first circuit board 10 can be increased. Therefore, the current carrying capacity and heat dissipation capacity of the electrical contact pad 11 are improved, and thus the current carrying capacity and heat dissipation capacity of the connector 30 are also improved.

As shown in FIGS. 1 and 2, the insulating housing 31 further comprises at least one positioning partition 31c connected between two side walls of the slot 31a and perpendicular to the two side walls. The positioning partition 31c is adapted to mate with a positioning notch 10c defined on an edge portion of the first circuit board 10 so as to position the first circuit board 10.

Figure 3:
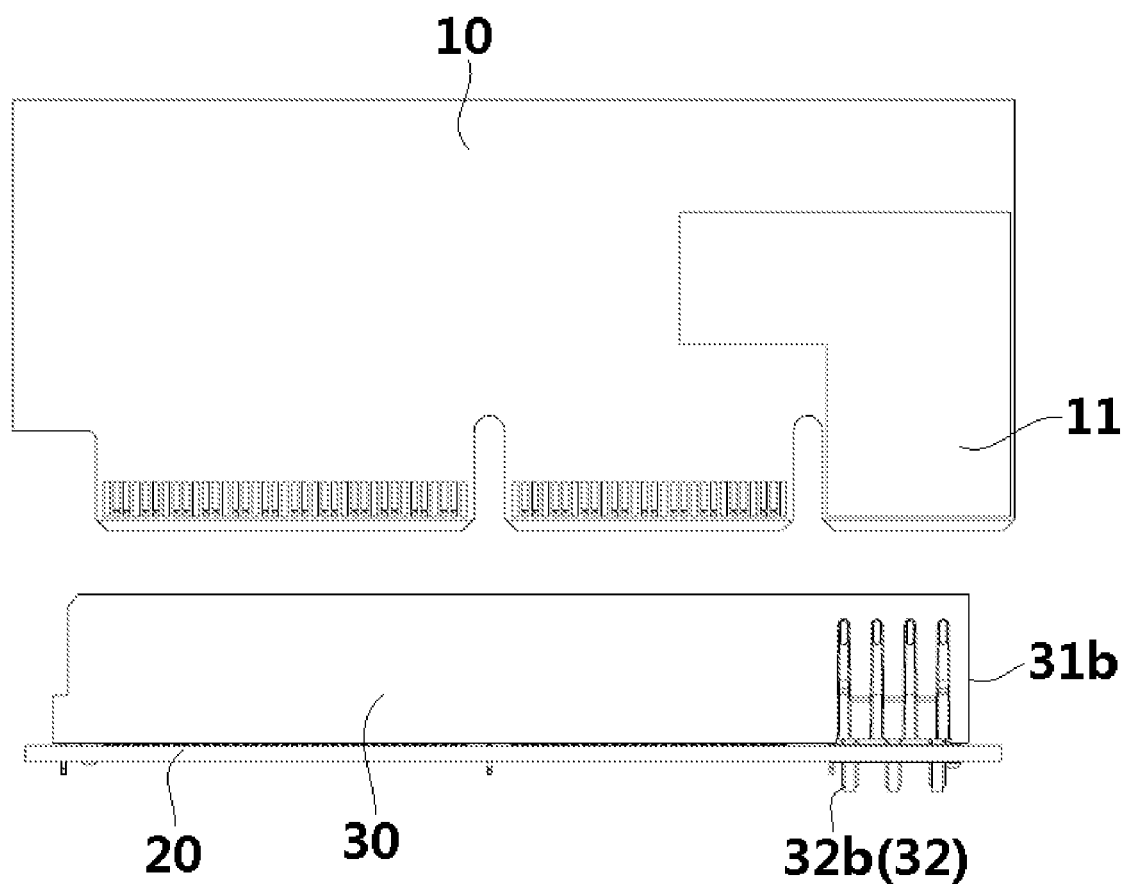
FIG. 3 shows a schematic perspective view of a connector assembly according to an exemplary embodiment of the present disclosure.

FIG. 3 shows a schematic perspective view of a connector assembly according to an exemplary embodiment of the present disclosure. As shown in FIGS. 1-3, the conductive terminal 32 has a plug 32b that extends out from the bottom of the insulating housing 31 and is adapted to be plugged into a socket on a second circuit board 20. The conductive terminal 32 has two rows of elastic contact arms 32a located on two sides of the slot 31a respectively, and adapted to be clamped onto the inserted first circuit board 10 to electrically contact with the first circuit board 10. The conductive terminal 32 further includes a fixing portion connected between the elastic contact arm 32a and the plug 32b. The fixing portion of the conductive terminal 32 may be fixed into a bottom wall of the insulating housing 31.

As shown in FIGS. 1 to 3, in an exemplary embodiment of the present disclosure, a connector assembly is further disclosed. The connector assembly comprises the aforementioned connector 30 and the first circuit board 10. The first circuit board 10 is adapted to be inserted into the slot 31a of the connector 30 and to electrically contact with the conductive terminal 32 of the connector 30. An electrical contact pad 11, which is adapted to electrically contact with the conductive terminal 32 of the connector 30, is formed on the first circuit board 10. When the first circuit board 10 is inserted into the slot 31a of the connector 30, the electrical contact pad 11 on the first circuit board 10 extends outside of the insulating housing 31 of the connector 30 via the open end 31b of the connector 30.

The conductive terminal 32 of the connector 30 has a plug 32b extending out from the bottom of the insulating housing 31. The connector assembly further comprises a second circuit board 20, and a socket is formed on the second circuit board 20, and the plug 32b is plugged into the socket on the second circuit board 20. A protruding positioning post 31d is also formed on the bottom of the insulating housing 31 of the connector 30. A positioning hole is formed on the second circuit board 20, and the positioning post 31d is inserted into the positioning hole on the second circuit board 20 for positioning the connector 30. The conductive terminal 32 of the connector 30 further has a fixing portion connected between the elastic contact arm 32a and the plug 32b, and the fixing portion of the conductive terminal 32 is fixed into a bottom wall of the insulating housing 31.

Figure 4:
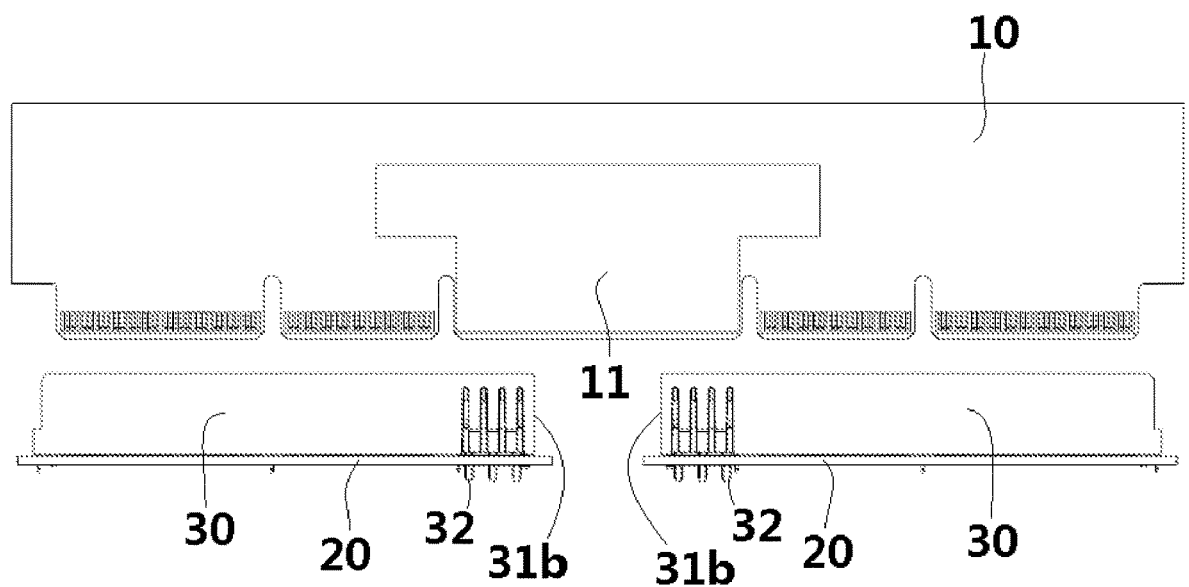
FIG. 4 shows a schematic perspective view of a connector assembly according to another exemplary embodiment of the present disclosure.

FIG. 4 shows a schematic perspective view of a connector assembly according to another exemplary embodiment of the present disclosure. As shown, the connector assembly comprises a single first circuit board 10, two second circuit boards 20, and two connectors 30 mounted on the two second circuit boards 20 respectively. The two second circuit boards 20 are arranged within the same horizontal plane, and the two connectors 30 are opposite to each other in a horizontal direction and spaced apart by a predetermined distance. The first circuit board 10 is inserted into the two connectors 30 in a vertical direction. A portion of the electrical contact pad 11 on the first circuit board 10 located between the open ends 31b of the two connectors 30 extends to the outside of the two connectors 30 via the open ends 31b of the two connectors 30.

Figure 5:
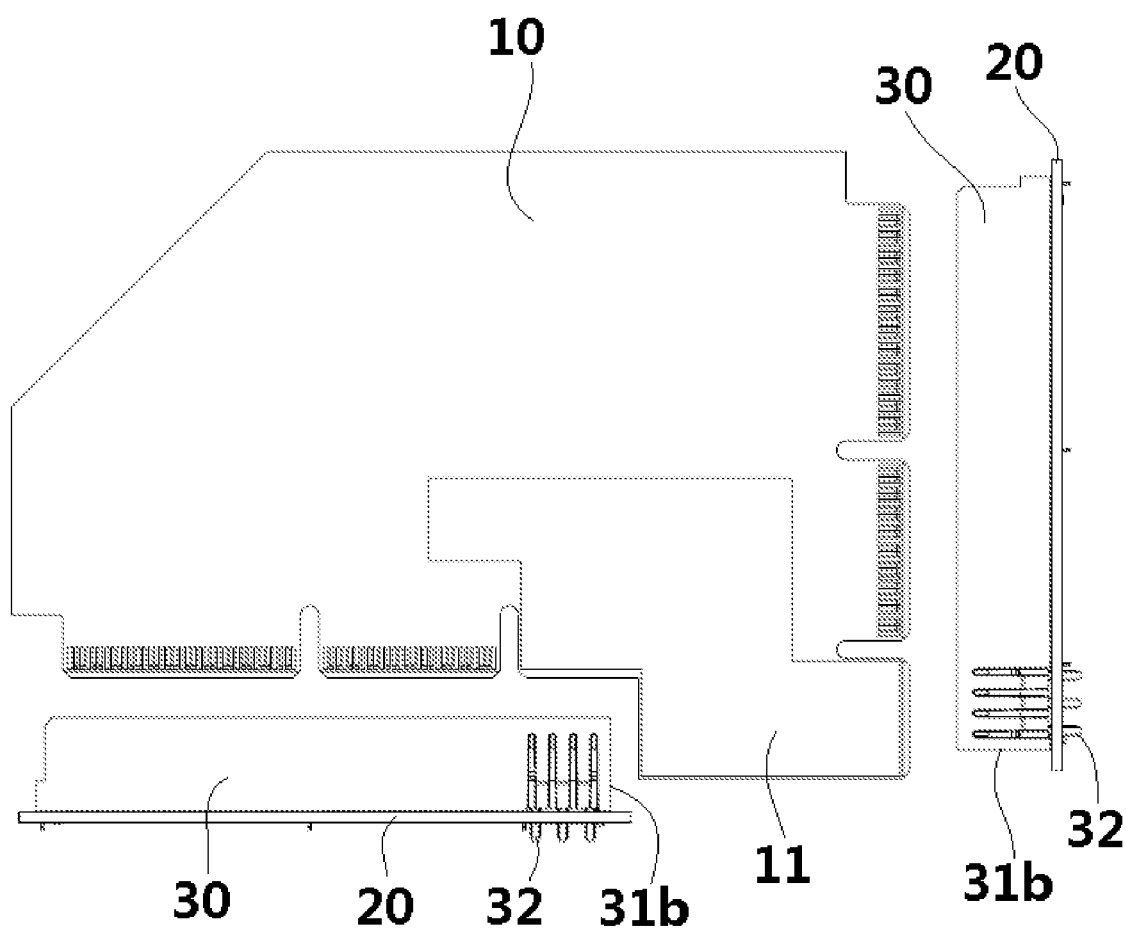
FIG. 5 shows a schematic perspective view of a connector assembly according to a yet another exemplary embodiment of the present disclosure.

FIG. 5 shows a schematic perspective view of a connector assembly according to another exemplary embodiment of the present disclosure. As shown, the connector assembly comprises a single first circuit board 10, two second circuit boards 20, and two connectors 30 mounted on the two second circuit boards 20 respectively. The two second circuit boards 20 are arranged within a horizontal plane and a vertical plane respectively, and the two connectors 30 extend perpendicularly to each other and are spaced apart by a predetermined distance in the horizontal direction. The first circuit board 10 is inserted into one of the two connectors 30 in the vertical direction, and is inserted into the other one of the two connectors 30 in the horizontal direction. A portion of the electrical contact pad 11 on the first circuit board 10 located between the open ends 31b of the two connectors 30 extends to the outside of the two connectors 30 via the open ends 31b of the two connectors 30.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A connector assembly, comprising:
   a first circuit board including an electrical contact pad formed in a single piece and extending along a surface of the first circuit board;
   a first connector defining a slot for receiving the first circuit board, the slot including a first electrical terminal for establishing electrical contact with the contact pad of the first circuit board, the first electrical terminal including a plug extending through a body of the first connector; and
   a second connector including a slot for receiving the first circuit board, the slot including a second electrical terminal for establishing electrical contact with the contact pad of the first circuit board, the second electrical terminal including a plug extending through a body of the second connector.

2. The connector assembly according to claim 1, further comprising:
   a second circuit board electrically connected to the plug of the first connector; and
   a third circuit board electrically connected to the plug of the second connector.

3. The connector assembly according to claim 2, wherein the first and second connectors are arranged orthogonally to one another and the second and third circuit boards are arranged orthogonally to one another.

4. The connector assembly according to claim 2, wherein the first and second connectors are arranged parallel to one another and the second and third circuit boards are arranged parallel to one another.

5. The connector assembly according to claim 2, wherein bottom surfaces of the first and second connectors each include a positioning post for engaging with the second and third circuit boards, respectively.

6. The connector assembly according to claim 2, the slots of each of the first and second connectors define at least one open end.

7. The connector assembly according to claim 6, wherein the electrical contact pad extends through the open end of each of the slots of the first and second connectors.

8. A connector assembly, comprising:
a pair of connectors each including:
   an insulating housing formed with a slot extending in a longitudinal direction, at least one of two opposite ends of the slot defining an open end; and
   a conductive terminal disposed within the slot, the conductive terminal includes a plug extending from a bottom of the insulating housing;
a first circuit board received within the slot and including an electrical contact pad contacting the conductive terminal, the electrical contact pad extending outside of the insulating housing in the longitudinal direction via the open end of the slot; and
a pair of second circuit boards each including a socket engaging with the plug, the pair of connectors are respectively mounted to the pair of second circuit boards, a first one of the second circuit boards is arranged within a horizontal plane and the second one of the second circuit boards is arranged within a vertical plane with the connectors of each of the second circuit boards extending perpendicularly to each other and being spaced apart by a predetermined distance in a horizontal direction, the first circuit board inserted into one of the pair of connectors in a vertical direction, and inserted into the another of the pair of connectors in a horizontal direction, with a portion of the electrical contact pad on the first circuit board extending outside of the open ends of each of the pair of connectors via the open ends.

* * * * *